(12) United States Patent
Eguchi

(10) Patent No.: US 6,358,767 B2  
(45) Date of Patent: Mar. 19, 2002

(54) METHOD OF MANUFACTURING SEMICONDUCTOR DEVICE

(75) Inventor: Shingo Eguchi, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 09/875,622

(22) Filed: Jun. 6, 2001

(30) Foreign Application Priority Data

Jun. 8, 2000 (JP) .......................................... 12-171507

(51) Int. Cl.$^7$ .............................................. H01L 21/00
(52) U.S. Cl. ..................... 438/30; 438/151; 438/158; 438/460; 438/462; 438/463; 349/40; 349/187; 349/192
(58) Field of Search ................... 438/30, 460, 462, 438/463, 151, 158; 349/40, 187, 192

(56) References Cited

U.S. PATENT DOCUMENTS 5,219,771 A * 6/1993 Miyake ........................ 437/40

6,160,268 A * 12/2000 Yamazaki

FOREIGN PATENT DOCUMENTS

| JP | 8-204199 | * | 8/1996 |
| JP | 8-330594 | * | 12/1996 |

OTHER PUBLICATIONS

English abstract of JP 8–204199.*
English abstract of JP 8–330594.*

* cited by examiner

*Primary Examiner*—John F. Niebling
*Assistant Examiner*—David A. Zarneke
(74) *Attorney, Agent, or Firm*—Cook, Alex, McFarron, Manzo, Cummings & Mehler, Ltd.

(57) ABSTRACT

In the steps of manufacturing a liquid crystal display, a step of reducing the electrostatic destruction of switching elements is provided. An electrostatic destruction preventing short-circuiting ring is left on an active matrix substrate until the execution of a short-circuiting bar-carrying FPC fixing step is finished. This enables the electrostatic destruction of the switching elements, which occurs due to the operations in a chamfering step to a FPC fixing step, to be reduced.

10 Claims, 6 Drawing Sheets

METHOD OF MANUFACTURING SEMICONDUCTOR DEVICE

BACKGROUND OF THE INVENTION

1. Field of the Invention

This invention relates to the techniques for improving the productivity of semiconductor devices, and more particularly to the techniques for preventing the electrostatic destruction of switching elements, such as thin film transistors (TFT's).

The semiconductor devices referred to in this specification indicate all of devices capable of being operated by utilizing the characteristics of a semiconductor, and an electro-optic device (which will hereinafter be referred to as a display), a semiconductor circuit and electronic equipment are all semiconductor devices.

2. Description of the Related Art

In recent years, the techniques for forming a TFT by using a semiconductor film (of around several to several hundred nm in thickness) provided on an insulating surface-carrying substrate have attracted the technicians' attention. A TFT is applied extensively to electronic devices, such as an integrated circuit (IC) and an electro-optic apparatus, and the development of the TFT as a switching element, especially, a liquid crystal display and a luminescent apparatus (EL type display) has been hastened. The switching element referred to in this specification indicates an element capable of attaining two modes of condition, i.e. an ON condition in which the resistance is low due to a voltage applied from the outside, and an OFF condition in which the resistance is high. and carrying out switching operations in accordance with the ON and OFF actions.

Accordingly, the use of a recent liquid crystal display as a monitor and a display of a portable terminal device is increasing, and the mass production of such liquid crystal displays is being forwarded.

In the manufacturing of an ultra-large-scale integrated circuit (ULSI), the manufacturing environment constitutes one of the factors having a large influence upon the yield and reliability of the product. There are many factors to be controlled and eliminated which include temperature and humidity, microvibration, static electricity, magnetic field variation and impurities. Therefore, the improvement of the yield and reliability of the products depends upon the way of attaining a high-quality environment. Regarding the providing of a high-quality environment, the occurrence of static electricity constitutes a factor exerting the greatest influence upon the improvement of the yield and reliability of the products.

Therefore, how to prevent the occurrence of static electricity comes to be important in a step of assembling such displays as mentioned above. In this specification, a liquid crystal display will be described as an example of a semiconductor device. A procedure for assembling a related art liquid crystal display will be described briefly with reference to FIG. 6.

(1) An element substrate is manufactured. The element substrate will hereinafter be referred to as an active matrix substrate.

(2) Spacers corresponding to desired cell gaps are provided, and a space between the active matrix substrate 601 and a counter-substrate 602 is thereby retained. The active matrix substrate 601 and counter-substrate 602 are bonded together with a sealant 609.

(3) The active substrate 601 and counter substrate 602 are pasted on each other, and the resultant product is thermally pressed. The thermal pressing is a step for manufacturing a panel not having an uneven space between the active substrate 601 and counter-substrate 602 by curing the thermosetting sealant with heat, and further applying pressure to the resultant product.

(4) A pair of pasted and thermally pressed substrates are divided into parts of a predetermined shape. The cutting is done so that a short-circuiting ring 606 (a portion shown by a thick line in FIG. 6) is left on a terminal end (end portion) of a wiring portion 605.

(5) The injecting of liquid crystals is done, and an injection port is sealed.

(6) The panel is washed.

(7) A re-orientation operation is carried out.

(8) The short-circuiting ring 606 is removed by chamfering, and the chamfered portion is washed.

(9) The fixing of a flexible printed circuit (FPC) is done. The flexible printed circuit will hereinafter be referred to as FPC.

The pasting of a polarizing plate is then carried out.

Since the active matrix substrate 601 is handled by an insulating material rarely contaminated with a metal and having a chemical resistance, the charge potential of the active matrix substrate 601 is high. A glass substrate itself mainly used for the active matrix substrate 601 and counter-substrate 602 is an insulator. Therefore, even when these substrates are handled by a conductive material, it is difficult to prevent the substrates from being electrically charged. When static electricity occurs in the insulating substrates, it causes switching elements and a holding capacitor (add-on capacitor) formed on the active matrix substrate 601 to be destroyed, and the characteristics of a TFT to be deteriorated, so that the quality of an image becomes low.

The short-circuiting ring 606 is provided so as to prevent the electrostatic destruction (destruction by static electricity) of a display picture element portion 603 on the active matrix substrate 601, and switching elements provided in peripheral driving circuits 604 thereon. The short-circuiting ring represents a wiring pattern for short-circuiting the terminal ends of wires on the active matrix substrate so as to prevent the electrostatic destruction of the switching elements. Namely, the short-circuiting ring is formed mainly of the portion of the conductor which is provided in parallel with an end surface of the active matrix substrate. The short-circuiting ring may not have an annular shape. It is usually necessary that the short-circuiting ring be removed before a point in time at which the manufacturing of the display is completed with the displaying of an image started. In the above-described display assembling procedure, the short-circuiting ring 606 is removed in the chamfering step, a final step of the panel assembling operation.

When the manufacturing of a liquid crystal display is done by such a related art liquid crystal display assembling procedure, the short-circuiting ring 606 (portion shown by a thick line in FIG. 6) is removed in the chamfering step (8). Therefore, the electrostatic destruction of the switching elements occurs in some cases in the operations in the chamfering step (8) to the FPC fixing step (9), and, in such cases, a decrease in the yield occurs.

The causes of the occurrence of the static electricity are classified into two, i.e. frictional charge occurring in a contact-separation operation, and charge occurring due to the supply of electric charge from the outside. In the chamfering step (8) above, frictional charge occurs due to the contact and separation of a chamfering unit with and from an end surface of a substrate. In the FPC fixing step (9), frictional charge occurs due to the contact of FPC with the wiring portion. Since the FPC fixing step (9) relies partially upon a handling operation, electric charge due to the supply of electric charge from the outside necessarily occurs. Due to the various types of electric charge mentioned above, electric discharge occurs via the thin insulating film provided on the TFT to cause the insulating characteristics of the TFT to be lost, and troubles to occur in a control unit which handles minute electric signals. Although the occurrence of static electricity is prevented in the chamfered portion washing step following the chamfering step, the electrostatic destruction of switching elements occurs with a probability of 9.1% in the operations in the chamfering step (8) to the FPC fixing step (9). Therefore, it is necessary that the electrostatic destruction of such elements be prevented in these steps.

SUMMARY OF THE INVENTION

The present invention has been made in view of the above-mentioned circumstances, and provides concerning a display dividing method, the techniques for obtaining a liquid crystal display capable of reducing the electrostatic destruction of switching elements and having a high yield.

According to the present invention, the electrostatic destruction of switching elements occurring due to the operations in the chamfering step to the FPC fixing step can be reduced by removing an electrostatic destruction preventing short-circuiting ring from an upper surface of an active matrix substrate by a substrate dividing operation after a short-circuiting bar-carrying FPC is fixed.

Since the short-circuiting ring has a function of preventing the electrostatic destruction of switching elements, it is desirable that the removing of the short-circuiting ring be done after the execution of the FPC fixing step. After the wiring portion on the side of the display and FPC are connected together, the detachable short-circuiting bar provided on the side of the FPC works also as a short-circuiting ring. Therefore, even when the short-circuiting ring is removed, a problem does not occur. The short-circuiting bar referred to in this specification is a conductor provided on the FPC. Even when the short-circuiting bar-carrying FPC and wiring portion on the active matrix substrate are connected together, the wiring portion on the active matrix substrate (including the wiring portion provided on the peripheral driving circuits and display picture element portion) can maintain their short-circuited condition even though the short-circuiting ring is cut off from an upper portion of the active matrix substrate.

According to an aspect of the present invention, the method of manufacturing semiconductor devices has the steps of:

preparing an active matrix substrate having a conductor formed of a wiring portion and a short-circuiting ring, connecting a short-circuiting bar-carrying flexible printed circuit to the wiring portion, and thereafter cutting off the short-circuiting ring from the conductor.

According to another aspect of the present invention, the method of manufacturing semiconductor devices has the steps of:

preparing an active matrix substrate having a conductor formed of a wiring portion and a short-circuiting ring, connecting a short-circuiting bar-carrying flexible printed circuit to the wiring portion, and cutting of f the short-circuiting ring from the conductor simultaneously with the circuit connecting operation.

According to still another aspect of the present invention, the method of manufacturing semiconductor devices is in accordance with the first- or second-mentioned method, in which the short-circuiting ring is cut off from the conductor by dividing the active matrix substrate.

According to a further aspect of the present invention, the method of manufacturing semiconductor devices is in accordance with the third-mentioned invention, in which the substrate dividing operation is carried out by using a scriber and a breaking machine.

According to another aspect of the present invention, the method of manufacturing semiconductor devices is in accordance with the third-mentioned invention, in which the substrate dividing operation is carried out by using a dicer.

According to still another aspect of the present invention, the method of manufacturing semiconductor devices is in accordance with the third-mentioned invention, in which the substrate dividing operation is carried out with a laser cutter.

BRIEF DESCRIPTION OF THE DRAWINGS

Preferred embodiments of the present invention will be described in detail with reference to the following figures, wherein.

DESCRIPTION OF THE PREFERRED EMBODIMENTS

Concrete examples of the present invention will now be described with reference to FIGS. 1–5.

Figure 1:
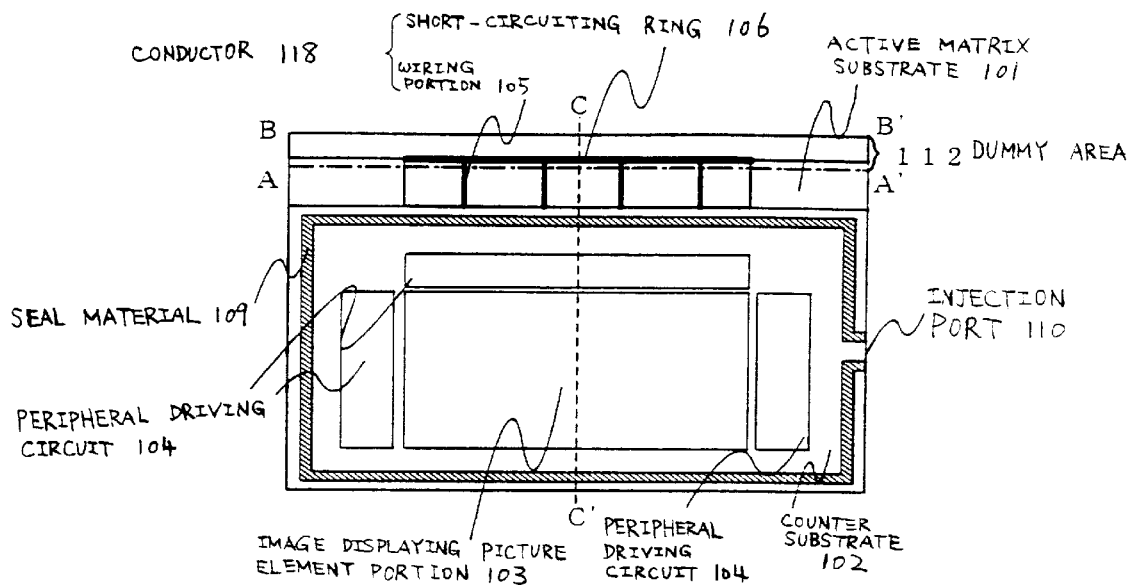
FIG. 1 is a top view and a sectional view of the liquid crystal display according to the present invention which has been subjected to the substrate dividing step.
Figure 1:
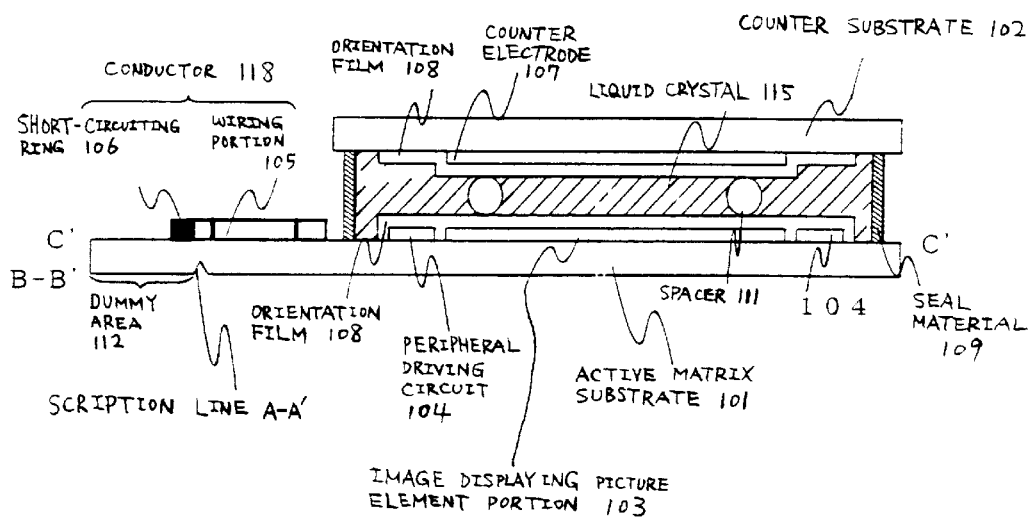
Figure 2:
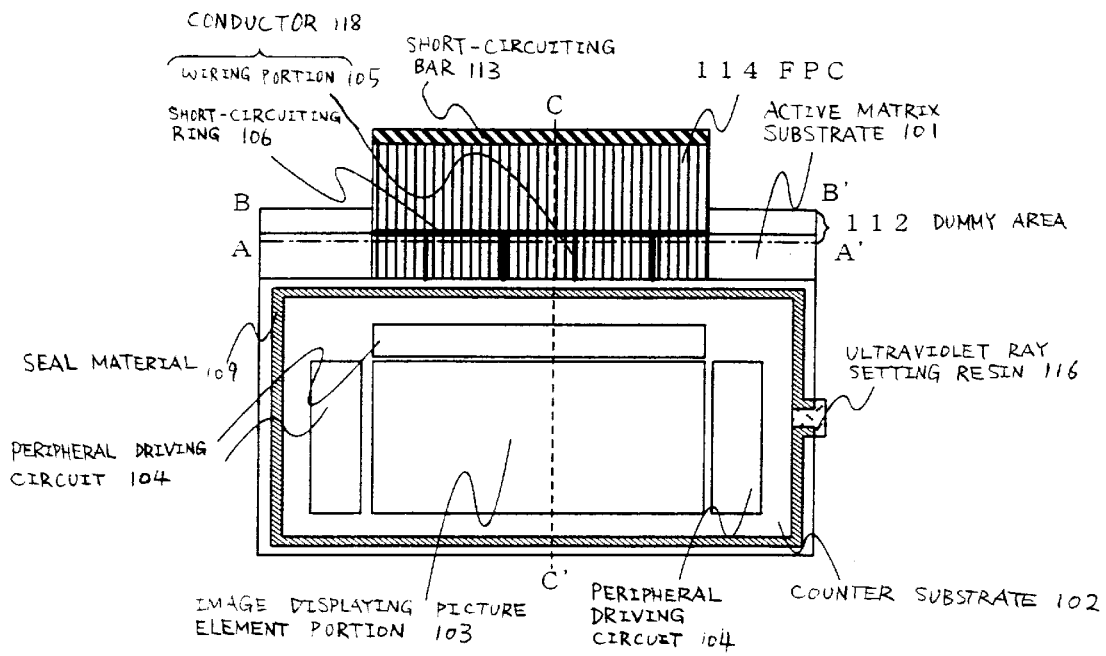
FIG. 2 is a top view and a sectional view of the liquid crystal display according to the present invention which has just been subjected to a FPC fixing step.
Figure 2:
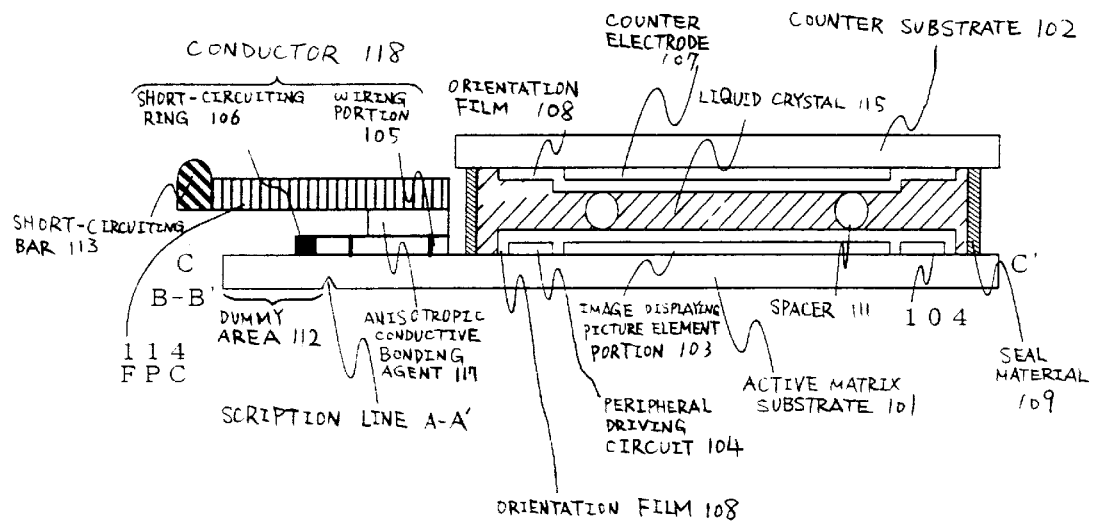
Figure 3:
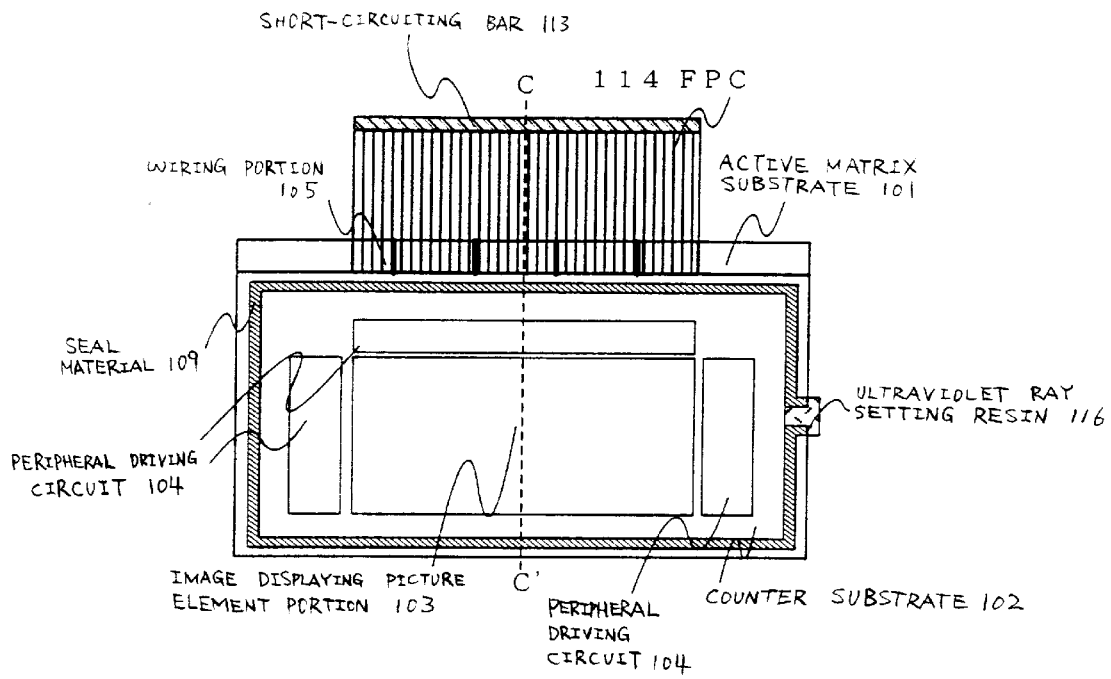
FIG. 3 is a top view and a sectional view of the liquid crystal display according to the present invention.
Figure 3:
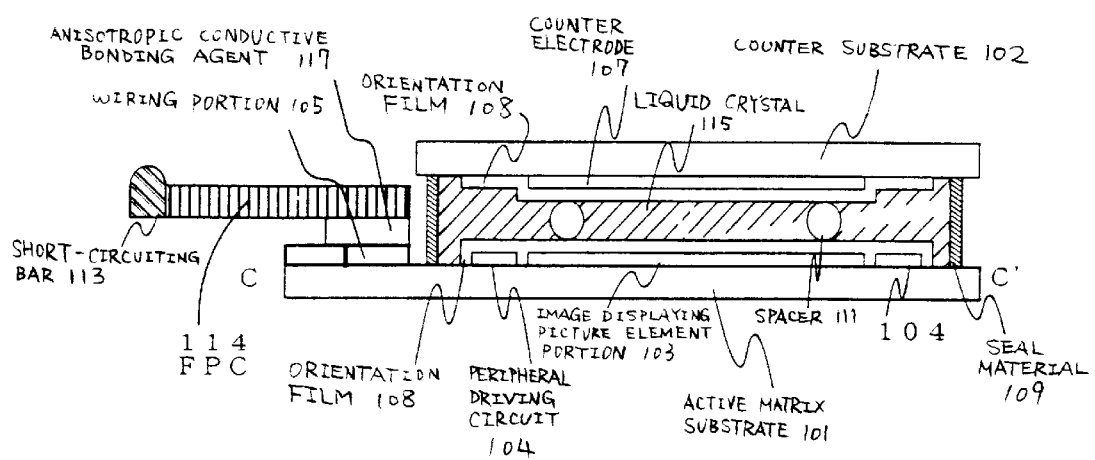
Figure 4:
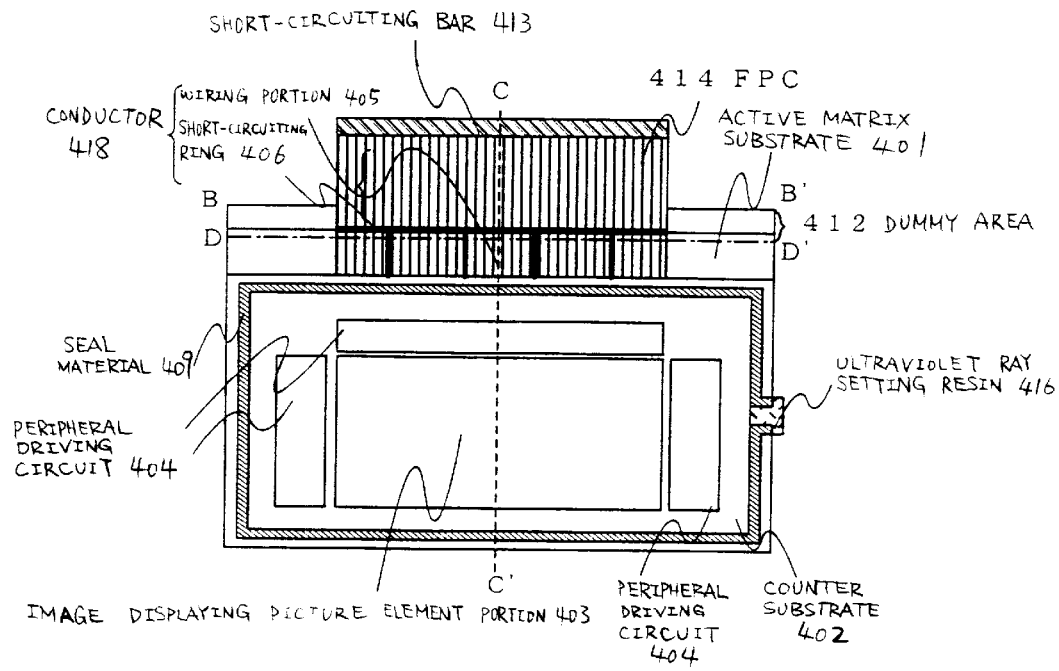
FIG. 4 is a top view and a sectional view of the liquid crystal display according to the present invention which has just been subjected to the FPC fixing step.
Figure 4:
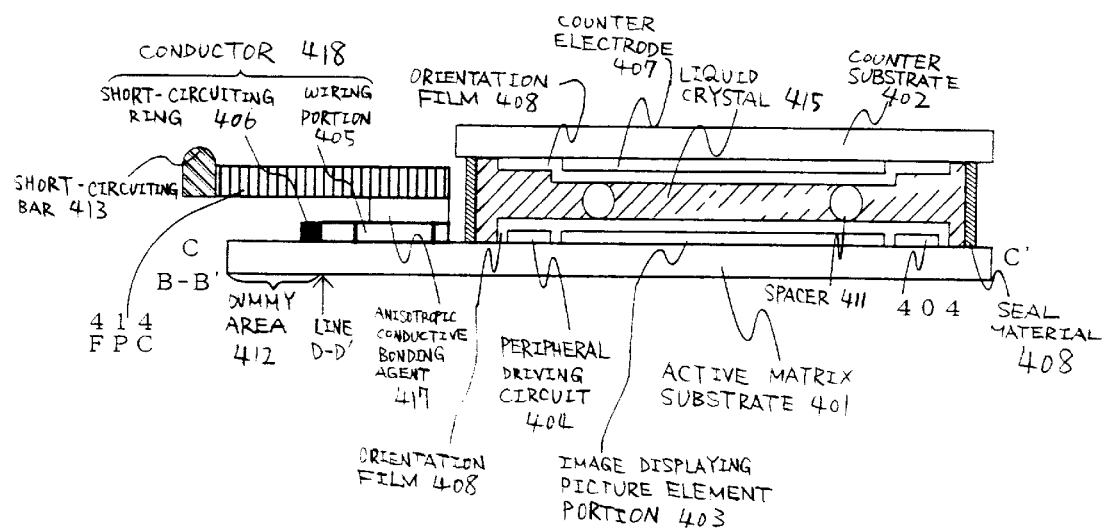
Figure 5:
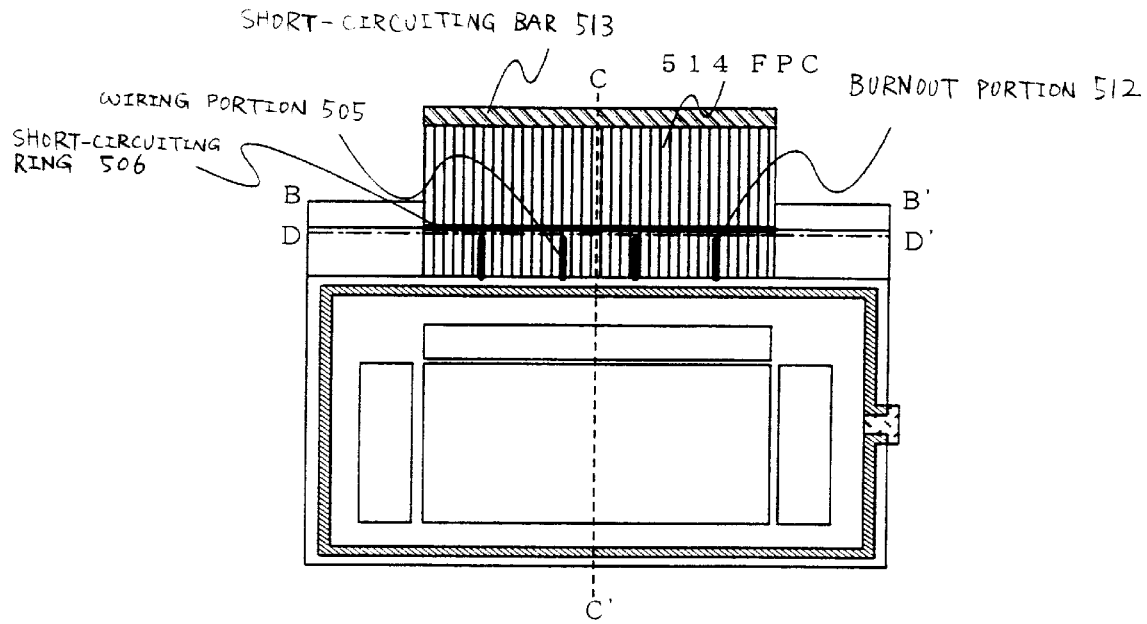
FIG. 5 is a top view and a sectional view of the liquid crystal display according to the present invention which has been subjected to a laser beam application operation.
Figure 5:
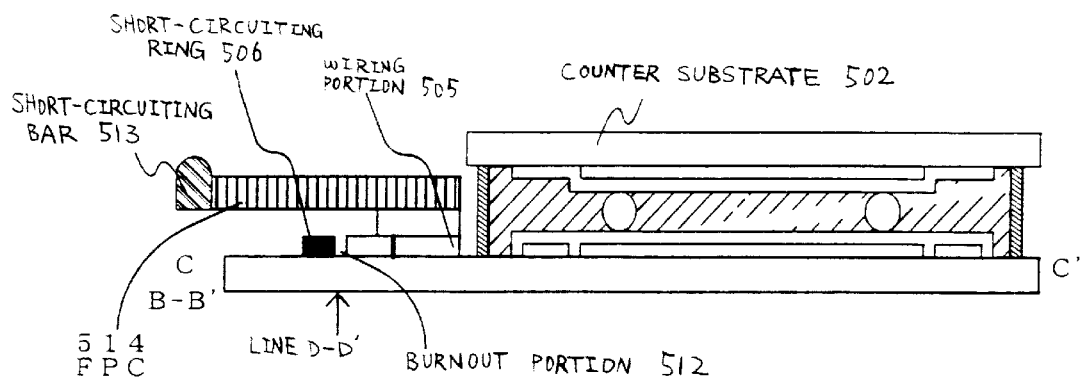
Figure 6:
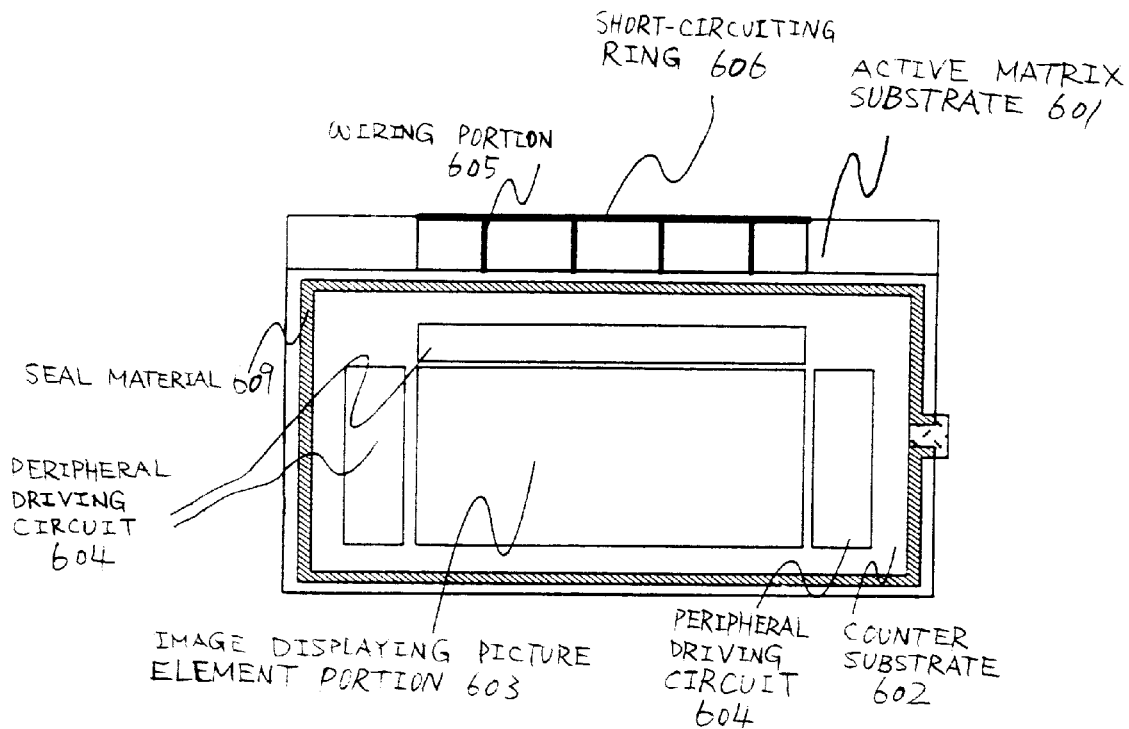
FIG. 6 illustrates an active matrix type liquid crystal display, which has not yet been subjected to a chamfering step, formed by a related art semiconductor device manufacturing method.

The top views and sectional views of modes 1, 2 of embodiment are shown in FIGS. 1–3. The top views and sectional views of a mode 3 of embodiment are shown in FIGS. 3–4. The top views and sectional views of a mode 4 of embodiment are shown in FIGS. 4–5. In this specification, separating a part of a substrate therefrom is defined as dividing. Cutting off a short-circuiting ring (a part of a conductor) from a conductor is also defined as dividing. FIG. 6 shows an active matrix type liquid crystal display manufactured by a related art method, and not yet subjected to a chamfering step.

In this specification, an active matrix substrate indicates a substrate provided with an image displaying picture element portion, peripheral driving circuits and a conductor, and a substrate provided with a wiring portion obtained by cutting off a short-circuiting ring from a conductor by a conductor dividing operation, an image displaying picture element portion and peripheral driving circuits shall also be called an active matrix substrate.

In this specification, a conductor indicates an object in which an electric current flows, a metal to be exact, and is formed of a wiring portion (an external wiring portion) on an active matrix substrate, and a short-circuiting ring electrically connected to the wiring portion. The wiring portion is an aggregation of wires electrically connected to peripheral driving circuits.

The image displaying picture element portion and peripheral driving circuits are provided with switching elements (TFT's in this specification). The image displaying picture element portion is a portion on which pictures and letters are displayed, while the peripheral driving circuits are driving circuits provided around the image displaying picture element portion and electrically connected to the image displaying picture element portion via wires.

Mode 1 of Embodiment

The method of manufacturing liquid crystal displays according to the present invention will now be described with reference to FIGS. 1–3. In order to manufacture a liquid crystal display, an active matrix substrate 101 and a counter substrate 102 are used. The active matrix substrate 101 is a substrate provided with an image displaying picture element portion 103, peripheral driving circuits 104 and a conductor 118. In the conductor 118, a portion thereof parallel to B–B' functions as a short-circuiting ring 106, and a portion of the conductor 118 left after a dividing operation is carried out, i.e., a portion left after the short-circuiting ring 106 is cut off from the conductor 118 as a wiring portion 105. The dividing operation is carried out by using a scriber and a breaking machine. The counter substrate 102 is a substrate provided so as to be opposed to the active matrix substrate 101, and having a counter electrode 107 and a color filter (not shown).

This mode of embodiment shows a method of manufacturing a liquid crystal display, having the steps of preparing an active matrix substrate 101 provided with a conductor 118 formed of a wiring portion 105 and a short-circuiting ring 106, connecting a FPC 114 provided with a short-circuiting bar 113 to the wiring portion 105, and thereafter cutting off the short-circuiting ring 106 from the conductor 118.

First, orientation films 108 are formed on the active matrix substrate 101 and counter substrate 102, and the resultant product is baked. The SE7792 (manufactured by the Nissan Kagaku Co., Ltd.) is used for the orientation films 108. The orientation films 108 are printed on predetermined regions of the active matrix substrate 101 and counter substrate 102 by a flexo-printing method. The orientation films 108 are formed so that the thickness of these films finished being subjected to the baking operation therefor becomes around 50 nm. The orientation films 108 are prebaked on a hot plate of 80° C. for 90 seconds, and thereafter baked in a clean oven of 250° C. for 1.5 hours.

The active matrix substrate 101 and counter substrate 102 finished being treated in such a manner are subjected to a rubbing treatment so that liquid crystal molecules are oriented at a predetermined pretilt angle. The rubbing direction is set so that a twist angle of the substrates which have finished being subjected to the injection of liquid crystals becomes 90°. The dust and fallen hair of a rubbing cloth occurring due to the rubbing treatment are removed by an ultrasonic cleaning operation.

A thermosetting seal material 109 (XN-21S manufactured by the Mitsui Kagaku Co., Ltd.) is then formed on the counter substrate 102 by using a dispense-drawing method. The width of a seal pattern formed by the seal material 109 is set so that it becomes 1.2–1.5 mm after pasting and thermal pressing operations are finished. The pattern of the seal material 109 is provided at a part thereof with an injection port 110, into which liquid crystals are injected. After the seal material 109 is formed, it is baked at 90° C. for around 0.5 hours.

Spacers 111 as gap retaining materials for maintaining a distance between the active matrix substrate 101 and counter substrate 102 are sprayed uniformly thereon. Polymer spacers, glass spacers or silica spacers can also be used as the spacers. In this embodiment, Micropearls SP-204 (manufactured by the Sekisui Fine Chemical Co., Ltd.) are used. The diameter of the spacers was 4 $\mu$m. The spacers are dry sprayed with a nitrogen gas, and a spray density of the spacers shall be set to 100 particles/cm$^2$.

The active matrix substrate 101 and counter substrate 102 passed through these steps are aligned with each other, and pasted on each other with a high accuracy. The two pasted substrates are bonded together by thermally pressing the same in a clean oven at 160° C. for around two hours with a pressure of 0.3–1.0 kgf/cm$^2$ applied to the whole of upper surfaces of the substrates in a perpendicular direction with respect to a plane of the substrates.

After the pasted substrates are cooled, a first dividing step is carried out by a scriber and a breaking machine. The breaking machine is an apparatus for dividing pasted substrates. The breaking machine is adapted to divide pasted substrates after a cut line is formed in the substrates by a scriber, with a pressure applied to the surface of the substrates which is opposite to the cut line-carrying surface thereof so as to make supplementary use of the cut line. In order to divide the active matrix substrate 101, the portion A–A' (scription line A–A') of a fundamentally lower surface of the substrate along which the substrate is to be divided is scribed as shown in FIG. 1, to form a scription line A–A'. In this specification, a cut line formed by the scriber is referred to as a scription line. A scription line is also formed on the portion B–B' which is spaced from the scription line A–A' by 5 mm toward the side of a margin to throw away. In the first dividing step, the substrate is divided along the B–B' line, and not along the A–A' line. Regarding the counter substrate, a dividing operation may be carried out in the same manner as in a related art method. When such dividing operations are carried out, a dummy area 112 (AA' B' B) is left on a cut-off panel. Unless the dummy area is removed, each wire is in an electrically short-circuited condition, so that the switching elements on the active matrix substrate 101 can be protected from static electricity. When in the first dividing step a cutting pressure of the scriber is set to 0.6–0.8 kgf/cm$^2$ with respect to a glass substrate, and 1.1–1.2 kgf/cm$^2$ with respect to a quartz substrate with a cutting depth set to around 0.1 mm, a crack which causes the substrate to be divided does not occur along the scription line A–A' before the FPC 114 having a short-circuiting bar 113 at an end portion thereof is connected. In this specification, the crack indicates a narrow opening occurring to split a substrate into pieces.

Liquid crystals are injected by a vacuum injection method. A divided panel is prepared in a liquid crystal injector (vacuum chamber), and the interior of the liquid crystal injector (vacuum chamber) is put in a vacuum condition of around $1.33 \times 10^{-5}$–$1.33 \times 10^{-7}$ Pa by a vacuum pump, and an injection port 109 is then immersed in a liquid crystal dish (not shown) in which liquid crystals are piled. In this embodiment, ZLI4792 (manufactured by the Merck Co., Ltd.) is used.

When the pressure in the interior of the vacuum chamber which is in a vacuum condition is then returned to an atmospheric pressure by adding nitrogen thereto gradually, the liquid crystals are injected into the injection port 110 owing to a difference between the pressure in the panel and the atmospheric pressure and an effect of a capillary phenomenon of the liquid crystals. The liquid crystals gradually advance from the injection port 110 to complete the injection step.

When it is ascertained that an inner side portion (inside) of the seal pattern formed of the seal material 109 is filled with the liquid crystals 115, both surfaces of the liquid crystal display panel are pressed by applying a uniform level of force thereto in the perpendicular direction with respect to the same surfaces. After the lapse of 15 minutes, the liquid crystals overflowing the injection port 110 are wiped off, and an ultraviolet ray setting resin 116 is applied to the injection port 110 with the display panel in a pressed state. The pressing force is then weakened. During this time, the ultraviolet ray setting resin 116 infiltrates into the injection port. The ultraviolet ray setting resin 116 in this condition is hardened by irradiating the same with ultraviolet rays (4–10 mW/cm$^2$, 120 second), the sealing of the injection port 110 being thus carried out.

The liquid crystals deposited on the outer surfaces and end surfaces of the liquid crystal display panel are then washed off with an organic solvent, for example, acetone and ethanol. The liquid crystals are thereafter reoriented at 130° C. in around 0.5 hours.

A FPC 114 having a short-circuiting bar 113 at an end portion thereof is then connected as shown in FIG. 2, via an anisotropic conductive bonding agent 117 to the wiring portion 105 out of the conductor 118 by the thermocompression bonding (290° C., 50–70 kPa). The anisotropic conductive bonding agent referred to in this specification is a bonding agent obtained by mixing conductive particles in a thermosetting resin film, and works so as to electrically connect the FPC and wiring portion together. The scription line A–A' drawn on the short-circuiting ring 106 during the first dividing step is pressed, i.e., a second dividing step is carried out by a manual pressing operation or a pressing operation using a breaking machine in this embodiment. A crack occurs on the scription line A–A', and the active matrix substrate 101 is divided into parts, so that the dummy area 112 is removed from the same substrate 101. As a result, the conductor 118 on the active matrix substrate 101 is also divided into parts, and the wiring portion 105 is formed by cutting off the short-circuiting ring 106 from the conductor 118. The portion of the lower surface of the active matrix substrate 101 which corresponds when it is viewed in the direction in which a displayed image can be seen to the portion of the conductor which is between the anisotropic conductive bonding agent 117 and short-circuiting ring 106 may be provided with a scription line. Thus, a liquid crystal display shown in FIG. 3 is obtained. Polarizing plates are further pasted on both surfaces of the liquid crystal display of FIG. 3, to complete the liquid crystal display. The short-circuiting bar 113 may be removed from the FPC 114 when an image is displayed.

Although the scription line A–A' is formed during the first dividing step in this mode of embodiment, it may be formed before the second dividing step.

In this mode of embodiment, an active matrix liquid crystal display using nematic liquid crystals is described but the present invention is not limited to this embodiment. The present invention can also be applied to a liquid crystal display using smectic liquid crystals or cholesteric liquid crystals. The present invention can also be applied to a display using an active matrix, for example, a luminescent apparatus (EL type display).

In this mode of embodiment, spherical spacers are sprayed. The spacers may also be formed to a predetermined shape in a predetermined position by a patterning operation in a photolithographic step. In this method, spacers may be formed in either the active matrix substrate 101 or the counter substrate 102. The spacers may have a columnar shape or a wall-like shape.

In this mode of embodiment, the seal material 109 is applied to the counter substrate 109. The seal material 109 may also be applied to the active matrix substrate 101.

Although SE7792 (manufactured by the Nissan Kagaku Co., Ltd.) is used in this mode of embodiment, a special limitation is not placed on the orientation films as long as they are regularly used orientation films.

In this mode of embodiment, a dispense-drawing method is used for the formation of the seal material. A screen printing method may also be used.

In this mode of embodiment, an immersion method is used as a liquid crystal injection method. A drop injection method for injecting liquid crystals into an injection port of a seal pattern may also be used. Liquid crystals may be applied to opposed surf aces of two substrates, which are then pasted on each other by processing a seal material formed of an ultraviolet ray setting resin. This injection method is called a lamination method.

The liquid crystal display in this mode of embodiment provided with a discharge port at the opposite side of an injection port can also be applied to the injection of liquid crystals under normal pressure.

The seal material is not limited to a thermosetting resin. An UV setting resin may also be used.

Mode 2 of Embodiment

In this mode of embodiment, a method of manufacturing a liquid crystal display of FIG. 3 which is different from the mode 1 of embodiment will be described with reference to FIGS. 1–3.

The other manufacturing steps have already been described in the paragraphs under the Mode 1 of embodiment, and please refer to these paragraphs for the details of these manufacturing steps. Therefore, the description of such manufacturing steps will be omitted in this part of the specification.

In order to manufacture a liquid crystal display, an active matrix substrate 101 and a counter substrate 102 are used. The active matrix substrate 101 is a substrate provided with an image displaying picture element portion 103, peripheral driving circuits 104 and a conductor 118. In the conductor 118, mainly a portion thereof parallel to B–B' functions as a short-circuiting ring 106, and a portion of the conductor 118 left after a dividing operation is carried out, i.e., a portion left after the short-circuiting ring 106 is cut off from the conductor 118 as a wiring portion 115. The counter substrate 102 is a substrate which is formed so as to be opposed to the active matrix substrate 101, and which has thereon a counter electrode 107 and a color filter (not shown).

In the mode 1 of embodiment, a FPC 114 is fixed to the wiring portion 105 by thermal compression bonding, and the short-circuiting ring 106 is then removed by separating a dummy area 112 by a manual operation from the active matrix substrate 101. The second mode of embodiment is characterized by setting the thermal compression bonding pressure higher than such a pressure employed in the mode 1 of embodiment, separating the dummy area 112 from the active matrix substrate 101 by carrying out a thermal compression bonding operation simultaneously with the execution of a step of fixing the FPC 114 to the wiring portion, and thereby cutting of f the short-circuiting ring 106. The FPC 114 used in this mode of embodiment is provided at an end portion of the short-circuiting bar 113.

In this mode of embodiment, a method of manufacturing a liquid crystal display is shown which is adapted to prepare the active matrix substrate 101 having a conductor 118 formed of the wiring portion 105 and short-circuiting ring 106, connect the FPC 114 having the short-circuiting bar 113 to the wiring portion 105, and thereafter cut off the short-circuiting ring 106 from the conductor 118.

A liquid crystal display panel shown in FIG. 1 is obtained through such steps as are used in the mode 1 of embodiment, i.e. a step of printing an orientation film 108, a rubbing step, a step of applying a seal material 109 to the substrates, a step of spraying spacers 111, a step of pasting the active matrix substrate 101 and counter substrate 102 on each other, a first dividing step having a step of forming a scription line on a lower surface of the active matrix substrate 101 and a step of injecting liquid crystals 115 into the inside of the substrates. A sealing step using an ultraviolet ray setting resin 116 and a step having washing and reorientation operations are thereafter carried out.

The thermal compression bonding pressure is then set higher than the level of such a pressure employed in the mode 1 of embodiment, and a crack is made to occur in the scription line A–A' simultaneously with the execution of an operation for connecting the FPC 114 having the short-circuiting bar 113 at an end portion thereof to the conductor 118 by thermal compression bonding (290° C., 60–80 kPa), to cause the active matrix substrate 101 to be divided into parts, and the dummy area 112 to be removed from the substrate 101. As a result, the conductor 118 on the active matrix substrate 101 is also divided into parts, and the short-circuiting ring 106 is cut off from the conductor 118 to form the wiring portion 105. The liquid crystal display shown in FIG. 3 is thereby obtained via such a structure as shown in FIG. 2 of the mode 1 of embodiment. Polarizing plates are then pasted on both surfaces of the liquid crystal display body of FIG. 3, to complete a liquid crystal display. The short-circuiting bar 113 may be removed from the FPC 114 when an image is displayed.

Although the scription line A–A' is formed in the first dividing step in this mode of embodiment, it may be formed before the first dividing step.

When the manufacturing steps in this mode of embodiment are used, the dummy area 112 is removed from the active matrix substrate 101 simultaneously with the execution of the step of fixing the FPC 114 by thermal compression bonding (pressing force). Therefore, the manufacturing steps are simplified as compared with those in the mode 1 of embodiment.

Mode 3 of Embodiment

In this mode of embodiment, a method of manufacturing a liquid crystal display of FIG. 3 which is different from the mode 1 of embodiment will be described with reference to FIG. 4.

Although a scription line is drawn on the portion of the dotted line A–A' in the first dividing step in the mode 1 of embodiment, such a scription line is not necessary in particular in the mode 3 of embodiment. This embodiment is characterized by providing a line on a portion of a dotted line D–D' formed in parallel with a short-circuiting ring 406, dividing into parts a conductor 418 on an active matrix substrate 401 along the line by a dicer in a second dividing step, and cutting off a short-circuiting ring 406 from a conductor 418 to form a wiring portion 405.

The other manufacturing steps have already been described in the paragraphs under the mode 1 of embodiment, and please refer to the mode 1 of embodiment for the details of these manufacturing steps. Therefore, the description of these manufacturing steps will be omitted in this part of the specification.

An active matrix substrate 401 and a counter substrate 402 are used. The active matrix substrate 401 is a substrate provided with an image displaying picture element portion 403, a peripheral driving circuits 404 and a conductor 418. In the conductor 418, mainly a portion thereof parallel to B–B' functions as the short-circuiting ring 406, and a portion of the same left after a dividing operation is carried out, i.e. a portion left after the short-circuiting ring 406 is cut off from the conductor 418 as the wiring portion 405. The dividing operation is carried out by using a dicer. The counter substrate 402 is provided thereon with a counter electrode 407 and a color filter (not shown).

In this mode of embodiment, a method of manufacturing a liquid crystal display is shown which is adapted to prepare the active matrix substrate 401 having a conductor 418 formed of the wiring portion 405 and short-circuiting ring 406, connect the FPC 414 having the short-circuiting bar 413 to the wiring portion 405, and thereafter cut off the short-circuiting ring 406 from the conductor 418.

A liquid crystal display panel shown in FIG. 4 is obtained through such steps as are used in the mode 1 of embodiment, i.e. the step of printing the wiring film 408, a rubbing step, a step of applying the seal material 409 to the substrates, a step of spraying spacers 411, a step of pasting the active matrix substrate 401 and counter substrate 402 on each other, a first dividing step, a step of injecting liquid crystals 415 into the inside of the substrates, a sealing step using an ultraviolet ray setting resin 416, a step having washing and reorienting operations, and a step of connecting the FPC 414 having a short-circuiting bar 413 to the wiring portion 405 via an anisotropic conductive bonding agent 417. The FPC 414 used in this mode of embodiment has the short-circuiting bar 413 at an end portion thereof.

When a line D–D' shown in FIG. 4 is provided, a region (BB'D'D) surrounded by the line D–D' and a dotted line B–B' becomes a dummy area 412. In this mode of embodiment, a second dividing step is carried out by using a dicer as a dividing device. The dicer is a device for dividing a substrate by rotating a hard cutter (dicing saw) at a high speed. Since the water is used so as to minimize the occurrence of heat and the production of a polishing effect during the use of the dicer, the FPC 414 may be protected from contacting the water.

After the FPC 414 having the short-circuiting bar 413 at an end portion thereof is fixed to the wiring portion 405, cracks are made to occur in the active matrix substrate 401 and conductor 418 by a dicer so that the cracks extend along the line D–D' and in parallel with the short-circuiting ring 406 when they are viewed in the direction in which a displayed image can be seen. The active matrix substrate 401 is thereby divided into parts along the line D–D'. Consequently, the dummy area 412 is cut off from the active matrix substrate 401, and the conductor 418 is divided into parts. The dividing of the conductor 418 into parts causes the short-circuiting ring 406 to be cut off therefrom to form the wiring portion 405. Polarizing plates are then pasted on both surfaces of a liquid crystal display body to complete a liquid crystal display. The short-circuiting bar 413 may be removed from the FPC 414 when an image is displayed.

The advantages of the use of a dicer reside in its capability of attaining a rate of occurrence of dividing errors lower than that obtained when a scriber is used, and a yield higher than that obtained when a scriber is used. Moreover, an end surface of a substrate obtained by a substrate dividing operation using a dicer has little unevenness, and is smooth as compared with an end surface of a substrate obtained by using a scriber.

In this mode of embodiment, the line D–D' is formed after the step of pasting the FPC 414 having the short-circuiting bar 413 on the wiring portion is carried out. The time at which the forming of the line D–D' is done is not specially limited as long as this operation is carried out before the execution of the second dividing step.

Mode 4 of Embodiment

In this mode of embodiment, a method of manufacturing a liquid crystal display of FIG. 5 which is different from the liquid crystal display of FIG. 3 will be described with reference to FIGS. 4–5.

The cutting off of the short-circuiting ring 406 from the active matrix substrate 401 done with a dicer in the mode 3 of embodiment is done by applying a laser beam to the line D–D' therealong by a laser cutter in the mode 4 of embodiment. A substrate dividing operation is carried out by using a laser cutter. Owing to the irradiation of the conductor with a laser beam, a burnout portion 512 occurs on the conductor 418, and a short-circuiting ring 506 is cut off from the conductor 418 to form awiring portion 505. The burnout portion means a portion in which the conductor is lost due to the application the laser beam thereto. Therefore, the short-circuiting ring 506 and wiring portion 505 come to be disconnected from each other due to the burnout portion 512.

The other manufacturing steps have already been described in the paragraphs under the modes 1 and 3 of embodiment, and please refer to the modes 1 and 3 of embodiment for the details of these manufacturing steps. Therefore, the description of these manufacturing steps will be omitted in this part of the specification.

In the mode 4 of embodiment, a method of manufacturing a liquid crystal display is shown, which has the steps of preparing the active matrix substrate 401 having the conductor 418 formed of the wiring portion 405 and short-circuiting ring 406, connecting the FPC 414 having the short-circuiting bar 413 to the wiring portion 405, and thereafter cutting the short-circuiting ring 506 from the conductor.

This mode of embodiment is identical with the mode 3 of embodiment with respect to the part thereof in which such a liquid crystal display as is shown in FIG. 4 is obtained with the line D–D' then formed. Namely, the active matrix substrate 401 having the conductor 418 formed of the wiring portion 405 and short-circuiting ring 406 is prepared, and the FPC having the short-circuiting bar 413 at an end portion thereof is connected to the wiring portion 405. When a laser beam is then applied to the conductor in parallel with the short-circuiting ring 406 of the same liquid crystal panel as shown in FIG. 4 and along the line D–D' by a laser cutter, the conductor 418 is divided into parts, and a liquid crystal display having a burnout portion 512 of FIG. 5 is obtained. The short-circuiting bar 513 may be bent so as to extend above the counter substrate 502 so that the FPC 514 is not irradiated with the laser beam. Due to the burnout portion 512, the short-circuiting ring 506 and wiring portion 505 are put in an electrically disconnected state, and the FPC 514 having the short-circuiting bar 513 and the wiring portion 505 come to be electrically connected together. Polarizing plates are then pasted on both surfaces of a liquid crystal display body of FIG. 5 to complete a liquid crystal display. The short-circuiting bar 513 is removed from the FPC 514 when an image is displayed.

The probability determined of occurrence of electrostatic destruction of switching elements in a liquid crystal display in which a burnout portion 512 is formed by a laser cutter after a FPC is pasted on a wiring portion as in this mode of embodiment was 0%.

The present invention can provide the techniques for obtaining a liquid crystal display of a high yield by minimizing the electrostatic destruction of switching elements, which occurs due to the operations in the chamfering step to the FPC fixing step, by cutting off the electrostatic destruction-preventing short-circuiting ring after the short-circuiting ring-carrying FPC is fixed to the wiring portion.

What is claimed is:

1. A method of manufacturing a semiconductor device, comprising the steps of:

preparing an active matrix substrate having a conductor formed of a wiring portion and a short-circuiting ring, connecting a flexible printed wiring board having a short-circuiting bar to the wiring portion, and cutting off the short-circuiting ring from the conductor.

2. A method according to claim 1, wherein the short-circuiting ring is cut off from the conductor by dividing the active matrix substrate into parts.

3. A method according to claim 2, wherein the dividing operation is carried out by using a scriber and a breaking machine.

4. A method according to claim 2, wherein the dividing operation is carried out by using a dicer.

5. A method according to claim 2, wherein the dividing operation is carried out by a laser cutter.

6. A method of manufacturing a semiconductor device, comprising the steps of:

preparing an active matrix substrate having a conductor formed of a wiring portion and a short-circuiting ring, connecting a flexible printed wiring board having a short-circuiting bar to the wiring portion, and cutting off the short-circuiting ring from the conductor simultaneously with the execution of the wiring board connecting step.

7. A method according to claim 6, wherein the short-circuiting ring is cut off from the conductor by dividing the active matrix substrate into parts.

8. A method according to claim 7, wherein the dividing operation is carried out by using a scriber and a breaking machine.

9. A method according to claim 7, wherein the dividing operation is carried out by using a dicer.

10. A method according to claim 7, wherein the dividing operation is carried out by a laser cutter.

* * * * *